(12) United States Patent
Lee et al.

(10) Patent No.: US 11,854,659 B2
(45) Date of Patent: Dec. 26, 2023

(54) MEMORY SYSTEM AND OPERATING METHOD DETERMINING TARGET STATUS READ CHECK PERIOD IN THERMAL THROTTLING MODE

(71) Applicant: SK hynix Inc., Icheon (KR)

(72) Inventors: Da Seul Lee, Icheon (KR); Seon Ju Lee, Icheon (KR); You Min Ji, Icheon (KR)

(73) Assignee: SK hynix Inc., Icheon (KR)

( * ) Notice: Subject to any disclaimer, the term of this patent is extended or adjusted under 35 U.S.C. 154(b) by 105 days.

(21) Appl. No.: 17/686,104

(22) Filed: Mar. 3, 2022

(65) Prior Publication Data

US 2023/0075808 A1 Mar. 9, 2023

(30) Foreign Application Priority Data

Sep. 3, 2021 (KR) .................... 10-2021-0117378

(51) Int. Cl.
*G11C 7/10* (2006.01)
*G11C 11/4074* (2006.01)
*G11C 7/04* (2006.01)

(52) U.S. Cl.
CPC .............. *G11C 7/1084* (2013.01); *G11C 7/04* (2013.01); *G11C 7/1057* (2013.01); *G11C 7/1069* (2013.01); *G11C 7/1096* (2013.01); *G11C 11/4074* (2013.01)

(58) Field of Classification Search
CPC ....... G11C 7/1084; G11C 7/04; G11C 7/1057; G11C 7/1069; G11C 7/1096; G11C 11/4074
USPC ...................................... 365/189.05
See application file for complete search history.

(56) References Cited

U.S. PATENT DOCUMENTS

| | | | |
|---|---|---|---|
| 9,535,607 B2 | 1/2017 | Yun et al. | |
| 9,760,311 B1* | 9/2017 | Amir ................ | G06F 1/3275 |
| 2014/0032949 A1* | 1/2014 | Kim ................ | G05D 23/1919 |
| | | | 713/322 |

FOREIGN PATENT DOCUMENTS

| | | |
|---|---|---|
| KR | 1020160100170 A | 8/2016 |
| KR | 1020180026106 A | 3/2018 |

* cited by examiner

*Primary Examiner* — Huan Hoang

(57) ABSTRACT

A memory system and a method of operating the memory system are provided. The memory system may determine, on a determination that the memory system enters thermal throttling mode, a target status read check period based on threshold voltage distribution offset for the target memory die, and set a timer to transmit a status read command for the target memory die to the memory device based on the target status read check period.

19 Claims, 15 Drawing Sheets

FIG.9

| DIE | Vth |
|---|---|
| DIE_1 | VTH_1 |
| DIE_2 | VTH_2 |
| ... | ... |
| DIE_N-1 | VTH_N-1 |
| DIE_N | VTH_N |

Target memory die ----- DIE_1

$Vth\_offset(DIE\_1) =$
$((VTH\_1 + VTH\_2 + \cdots$
$+ VTH\_N-1 + VTH\_N)/N) - (VTH\_1)$

MEMORY SYSTEM AND OPERATING METHOD DETERMINING TARGET STATUS READ CHECK PERIOD IN THERMAL THROTTLING MODE

CROSS-REFERENCES TO RELATED APPLICATION

This patent document claims the priority and benefits of Korean patent application number 10-2021-0117378 filed on Sep. 3, 2021, which is incorporated herein by reference in its entirety.

TECHNICAL FIELD

Various embodiments of the present disclosure generally relate to a memory system and an operating method thereof.

BACKGROUND

A memory system includes a data storage device that stores data on the basis of a request from a host such as a computer, a server, a smartphone, a tablet PC, or another electronic device. Examples of the memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may include a memory device and a memory controller for controlling the memory device. The memory controller may receive the request from the host and, on the basis of the received request, may execute a command corresponding to the request or control read/write/erase operations to be performed on the memory device. The memory controller may execute firmware for performing a logical operation to control such operations.

The memory device included in the memory system may include a plurality of memory dies. At this time, the performance of each of the plurality of memory dies may vary with a temperature of each of the plurality of memory dies.

SUMMARY

Various embodiments of the present disclosure are directed to a memory system and an operating method thereof, capable of adjusting a temperature of each of a plurality of memory dies included in the memory system.

In addition, various embodiments of the present disclosure are directed to a memory system and an operating method thereof, capable of solving a problem that, because of an increase of a temperature of a specific memory die, an error rate of the specific memory die increases and the performance of the specific memory die degrades.

In one aspect, embodiments of the disclosed technology may provide a memory system including: a memory device including a plurality of memory dies; a memory controller coupled to communicate with the memory device and configured to control the memory device; and a timer configured to transmit status read command for each of the plurality of memory dies to the memory device based on status read check period set for each of the plurality of memory dies.

The memory controller may determine, on a determination that the memory system enters thermal throttling mode, a target status read check period, which is status read check period for a target memory die among the plurality of memory dies, based on threshold voltage distribution offset for the target memory die.

The memory controller may set the timer to transmit the status read command for the target memory die to the memory device based on the target status read check period.

In another aspect, embodiments of the disclosed technology may provide a method for operating a memory system including a) a memory device including a plurality of memory dies, b) a timer configured to transmit status read command for each of the plurality of memory dies to the memory device based on status read check period set for each of the plurality of memory dies.

The method for operating a memory system may include determining whether the memory system enters thermal throttling mode.

The method for operating a memory system may include determining a target status read check period, which is status read check period for a target memory die among the plurality of memory dies, based on threshold voltage distribution offset for the target memory die.

The method for operating a memory system may include setting the timer to transmit the status read command for the target memory die to the memory device based on the target status read check period.

According to embodiments of the present disclosure, it is possible to adjust a temperature of each of the plurality of memory dies and thus solve the drawbacks due to the increase of the temperature of the specific memory die.

BRIEF DESCRIPTION OF THE DRAWINGS

FIG. 9 illustrates an operation of determining a threshold voltage distribution offset for a target memory die in accordance with an embodiment of the present disclosure.

DETAIL DESCRIPTION OF THE EXEMPLARY EMBODIMENTS

Figure 1:
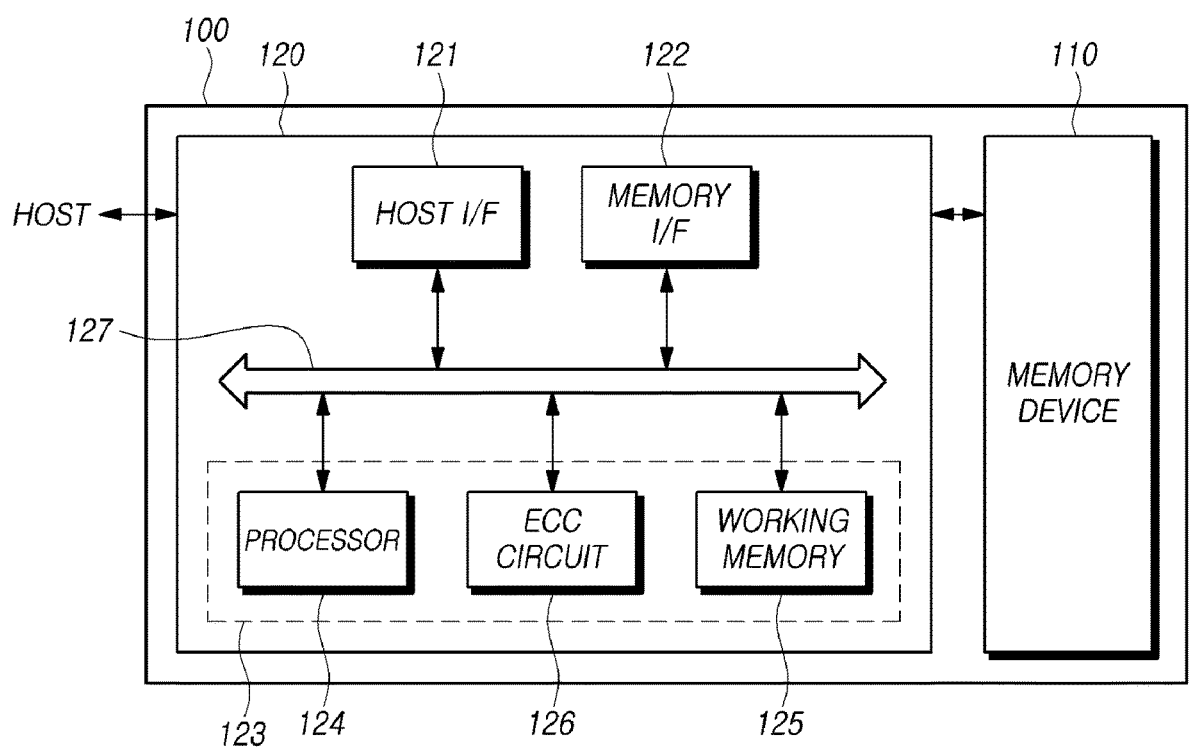
FIG. 1 illustrates a memory system in accordance with an embodiment of the present disclosure.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 illustrates a memory system 100 in accordance with an embodiment of the present disclosure.

The memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each memory block includes different pages of memory cells. In typical implementations of NAND flash memory devices, a page of memory cells is the smallest unit for programming or writing data, and data stored in the memory cell array is erased on a block by block basis.

The memory device 110 may be implemented as one of various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like.

The memory device 110 may be implemented in a three-dimensional array structure. Some embodiments of the present disclosure are applicable to any type of flash memory devices having an electric charge storage layer. In an embodiment, the electric charge storage layer may be formed of a conductive material, and such an electric charge storage layer can be called a floating gate. In another embodiment, the electric charge storage layer may be formed of an insulating material, and such a flash memory device can be called a charge trap flash (CTF) memory device.

The memory device 110 may be configured to receive a command and an address from the memory controller 120 to access an area of the memory cell array that is selected using the address. That is, the memory device 110 may perform an operation corresponding to the received command on a memory area of the memory device 110 having a physical address corresponding to the received address from the memory controller 120.

In some embodiments, the memory device 110 may perform a program operation, a read operation, an erasure operation, and the like. During the program operation, the memory device 110 may write data in the area selected by the address. During the read operation, the memory device 110 may read data stored in the area selected by the address. During the erasure operation, the memory device 110 may erase data stored in the area selected by the address.

The memory controller 120 may control write (or program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control an operation of the memory device 110 based on a request of a host HOST. Alternatively, the memory controller 120 may control an operation of the memory device 110 even in absence of the request from the host HOST when it performs such background operations of the memory device 110.

The memory controller 120 and the host HOST may be separate devices. In some embodiments, the memory controller 120 and the host HOST may be integrated into a single device. In the following description, the memory controller 120 and the host HOST will be discussed as separate devices as an example.

Referring to FIG. 1, the memory controller 120 may include a memory interface 122, a control circuit 123, and a host interface 121.

The host interface 121 may be configured to provide an interface for communication with the host HOST.

When receiving the request from the host HOST, the control circuit 123 may receive the request through the host interface 121 and may perform an operation of processing the received request.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform operations on the memory device 110 based on control signals and instructions from the control circuit 123.

The control circuit 123 may be configured to control the operation of the memory device 110. For example, the control circuit 123 may include a processor 124 and a working memory 125. The control circuit 123 may further include an error detection/correction circuit (ECC circuit) 126 or the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage memory operations on the memory system 100. The processor 124 may translate a logical block address (LBA) provided by the host HOST into a physical block address (PBA) through the use of the FTL. The FTL may receive the LBA and translate the LBA into the PBA by using a mapping table.

There are various address mapping methods which may be employed by the FTL, according to a mapping unit. Typical address mapping methods may include a page mapping method, a block mapping method, and a hybrid mapping method.

The processor 124 may be configured to randomize data received from the host HOST to write the randomized data to the memory cell array. For example, the processor 124 may randomize data received from the host HOST by using a randomizing seed. The randomized data is provided to the memory device 110 and written to the memory cell array.

The processor 124 may be configured to derandomize data received from the memory device 110 during a read operation. For example, the processor 124 may derandomize the data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute or drive the firmware loaded into the working memory 125 during booting.

The firmware refers to a program or software stored in a certain nonvolatile memory and is executed inside the memory system 100.

In some embodiments, the firmware may include various functional layers. For example, the firmware may include at least one of a flash translation layer (FTL) configured to translate a logical address from the host HOST to a physical address of the memory device 110, a host interface layer (HIL) configured to interpret a request that the host HOST issues to a command used in a data storage device such as the memory system 100, and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, a volatile memory such as a static RAM (SRAM), a dynamic RAM (DRAM), a synchronous RAM (SDRAM), or the like.

The error detection/correction circuit 126 may be configured to detect and correct one or more erroneous bits in data by using an error detection and correction code. In some embodiments, the data that is subject to the error detection and correction may include data stored in the working memory 125 and data retrieved from the memory device 110.

The error detection/correction circuit 126 may be implemented to decode the data by using the error correction code. The error detection/correction circuit 126 may be implemented by using various decoding schemes. For example, the error detection/correction circuit 126 may include a decoder for performing nonsystematic code decoding or a decoder for performing systematic code decoding.

In some embodiments, the error detection/correction circuit 126 may detect one or more erroneous bits on a sector by sector basis. Read data may include multiple sectors. In the present disclosure, a sector may refer to a data unit that is smaller than a read unit (e.g., page) of a flash memory. Sectors constituting the read data may be mapped based on addresses.

In some embodiments, the error detection/correction circuit 126 may calculate a bit error rate (BER) and determine whether the number of erroneous bits in the read data is within the error correction capability on the sector by sector basis. For example, if the BER is higher than a reference value, the error detection/correction circuit 126 may determine that the erroneous bits in the corresponding sector are uncorrectable and the corresponding sector is marked "fail." If the BER is lower than or equal to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to perform the error detection and correction operation on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address corresponding to uncorrectable bits) to the processor 124.

The memory system 100 may further include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the memory controller 120 that includes the above-mentioned constituent elements 121, 122, 124, 125, and 126. However, it is noted that some of the elements 121, 122, 124, 125, and 126 may be omitted, or some of the above-mentioned constituent elements 121, 122, 124, 125, and 126 of the memory controller 120 may be integrated into a single element. In addition, in some embodiments, one or more other constituent elements may be added to the memory controller 120.

Figure 2:
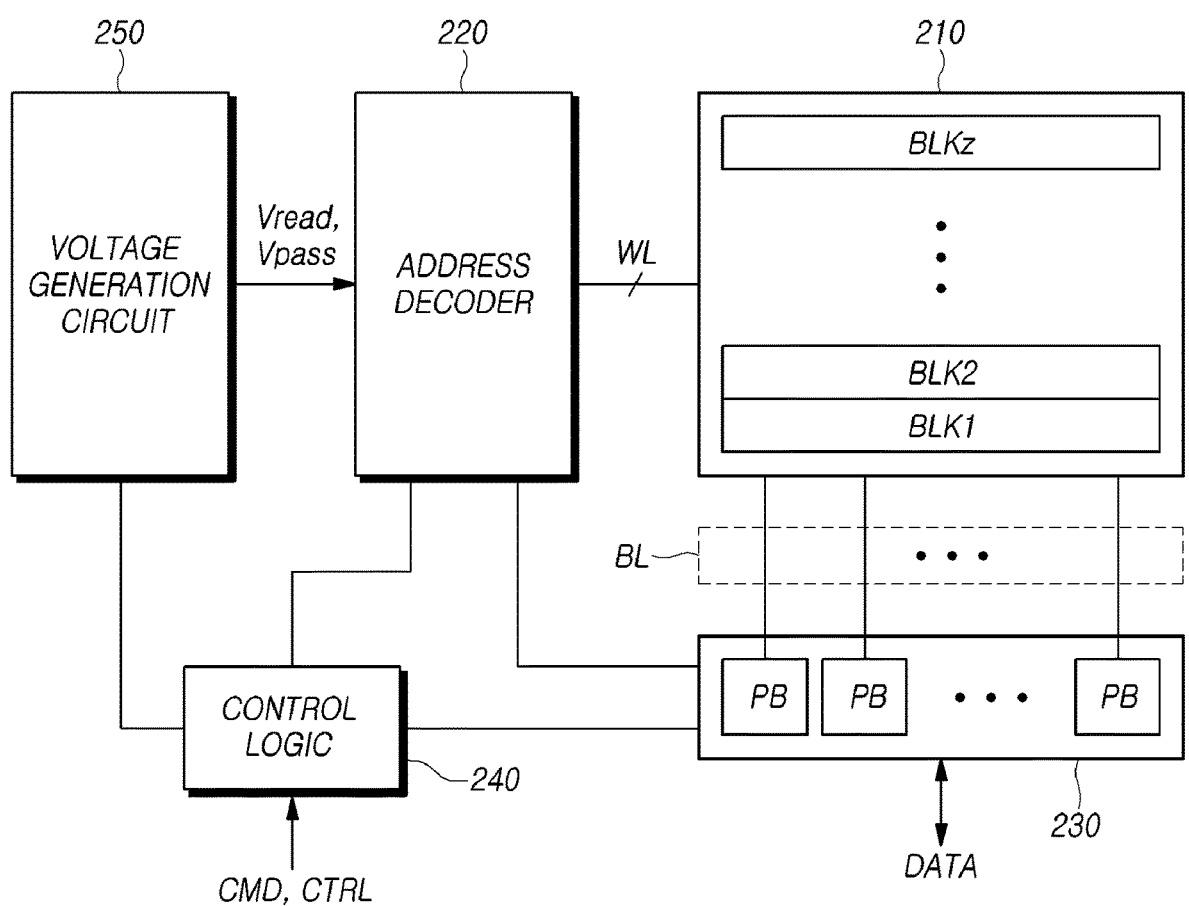
FIG. 2 illustrates a memory device in accordance with an embodiment of the present disclosure.

FIG. 2 illustrates a memory device 110 in accordance with an embodiment of the present disclosure. The memory device 110 of FIG. 2 may correspond to the memory device 110 shown in FIG. 1.

Referring to FIG. 2, the memory device 110 may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged between the multiple word lines WL and the multiple bit lines BL.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some embodiments, such nonvolatile memory cells may be arranged in a vertical channel structure.

The memory cell array 210 may be configured as a memory cell array having a two-dimensional structure. In some embodiments, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data. As another example, each of the multiple memory cells included in the memory cell array 210 may be a triple-level cell (TLC) configured to store three bits of data. As another example, each of the multiple memory cells included in the memory cell array 210 may be a quad-level cell (QLC) configured to store four bits of data. As another example, the memory cell array 210 may include multiple memory cells, each of which may be configured to store at least five bits of data.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block among the multiple memory blocks BLK1-BLKz based on the decoded block address.

The address decoder 220 may receive a read voltage Vread and a pass voltage Vpass from the voltage generation circuit 250.

During a read operation, the address decoder 220 may apply the read voltage Vread to a selected word line WL among multiple word lines WL coupled to a selected memory block and apply the pass voltage Vpass to the remaining non-selected word lines WL among the multiple word lines WL.

During a program verification operation, the address decoder 220 may apply a verification voltage generated by the voltage generation circuit 250 to the selected word line WL, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received to perform the read operation and the program operation may include at least one of a block address, a row address, and a column address.

The address decoder 220 may select one memory block from among the multiple memory blocks BLK1-BLKz based on the block address and one word line from among the multiple word lines WL based on the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The read/write circuit 230 is also referred to as a page buffer circuit or a data register circuit. The read/write circuit 230 may include a data buffer that participates in a data processing function and, in some embodiments, may further include a cache buffer for data caching.

The multiple page buffers PB may be connected to the memory cell array 210 through the multiple bit lines BL. In order to detect or sense a threshold voltage Vth of the memory cells during a read operation and a program verification operation, the multiple page buffers PB may continuously supply a sensing current to the bit lines BL connected to the memory cells to detect, at a sensing node, a change proportional to an amount of current that varies depending on a program state of a corresponding memory cell, and may hold or latch a voltage corresponding to the detected change as sensing data.

The read/write circuit 230 may operate in response to page buffer control signals output from the control logic 240.

During a read operation, the read/write circuit 230 senses a voltage value of a memory cell, and the voltage value is retrieved as read data. The read/write circuit 230 temporarily stores the retrieved read data, and outputs it as data DATA to the input/output buffer of the memory device 110. In an embodiment, the read/write circuit 230 may include a column selection circuit in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting voltage levels at sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In the memory block BLK, a plurality of memory cells arranged in columns form multiple memory cell strings, and a plurality of memory cells arranged in rows form the multiple pages PG. Each of the multiple pages PG is coupled to one of multiple word lines WL, and each of the memory cell strings STR is coupled to one of multiple bit lines BL.

In the memory block BLK, the multiple word lines WL and the multiple bit lines BL may be arranged in rows and columns. For example, each of the multiple word lines WL may be arranged in a row direction, and each of the multiple bit lines BL may be arranged in a column direction. As another example, each of the multiple word lines WL may be arranged in the column direction, and each of the multiple bit lines BL may be arranged in the row direction.

The multiple word lines WL and the multiple bit lines BL may intersect with each other, thereby addressing a single memory cell in an array of multiple memory cells MC. In some embodiments, each memory cell MC may include a transistor TR that includes a material layer that can hold an electrical charge.

For example, the transistor TR included in each memory cell MC may include a drain, a source, and a gate. The drain (or source) of the transistor TR may be connected to a corresponding bit line BL directly or via another transistor TR. The source (or drain) of the transistor TR may be connected to a source line (which may be the ground) directly or via another transistor TR. The gate of the transistor TR may include a floating gate (FG) surrounded by an insulator, and a control gate (CG) to which a gate voltage is applied from a word line WL to which the memory cell MC is coupled.

In each of the multiple memory blocks BLK1-BLKz, a first selection line (also referred to as a source selection line or a drain selection line) may be additionally arranged outside a first outermost word line of two outermost word lines, which is closer to the read/write circuit 230, and a second selection line (also referred to as a drain selection line or a source selection line) may be additionally arranged outside a second outermost word line of the two outermost word lines.

In some embodiments, at least one dummy word line may be additionally arranged between the first outermost word line and the first selection line. In addition, at least one dummy word line may be additionally arranged between the second outermost word line and the second selection line.

A read operation and a program operation (or write operation) of the memory block may be performed page by page, and an erasure operation thereof may be performed memory block by memory block.

Figure 3:
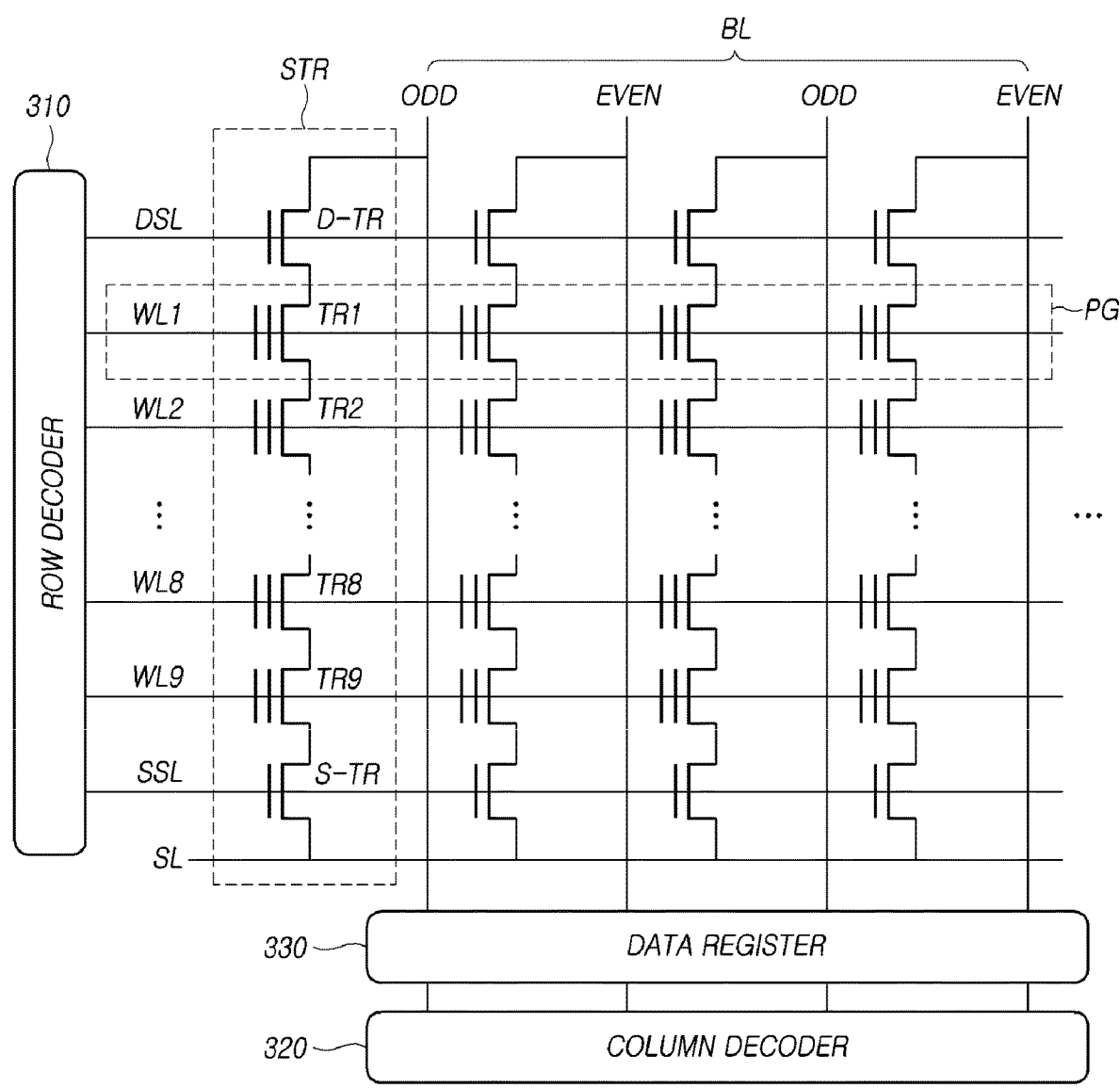
FIG. 3 illustrates word lines and bit lines of a memory device in accordance with an embodiment of the present disclosure.

FIG. 3 illustrates word lines WL and bit lines BL of a memory device in accordance with an embodiment of the present disclosure. The memory device of FIG. 3 may correspond to the memory device 110 shown in FIG. 1.

Referring to FIG. 3, the memory device has a core area in which memory cells MC are arranged, and an auxiliary area (the remaining area other than the core area) to include circuitry that is used to perform operations of a memory cell array. The memory cell array illustrated in FIG. 3 may correspond to the memory cell array 210 shown in FIG. 2.

In the core area, a certain number of memory cells arranged in one direction can be called a "page" PG, and a certain number of memory cells that are coupled in series to each other can be called a "memory cell string" STR.

Word lines WL1-WL9 may be connected to a row decoder 310. Bit lines BL may be connected to a column decoder 320. A data register 330, which corresponds to the read/write circuit 230 of FIG. 2, may be disposed between the multiple bit lines BL and the column decoder 320.

The multiple word lines WL1-WL9 may correspond to multiple pages PG, respectively.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting the program operation and the read operation.

The multiple bit lines BL may be connected to the column decoder 320. In some embodiments, the multiple bit lines BL may be divided into odd-numbered bit lines BL and even-numbered bit lines BL such that a pair of odd-numbered bit line and even-numbered bit line is coupled in common to the column decoder 320.

In accessing a memory cell MC, the row decoder 310 and the column decoder 320 are used to locate the desired memory cell MC based on an address.

In some embodiments, the data register 330 plays an key role because all data processing by the memory device, including program and read operations, occurs via the data register 330. If data processing by the data register 330 is delayed, all of the other components of the memory device need to wait until the data register 330 finishes the data processing, and thus the overall performance of the memory device may be degraded.

Referring to FIG. 3, in one memory cell string STR, multiple transistors TR1-TR9 may be connected to the multiple word lines WL1-WL9, respectively. The multiple transistors TR1-TR9 may correspond to memory cells MC. For example, the multiple transistors TR1-TR9 each include a control gate CG and a floating gate FG.

The multiple word lines WL1-WL9 include first and second outermost word lines WL1 and WL9. A first selection line DSL may be additionally arranged outside the first outermost word line WL1, which is closer to the data register 330 and has a shorter signal path compared to the second outermost word line WL9. A second selection line SSL may be additionally arranged outside the second outermost word line WL9.

A first selection transistor D-TR, which is controlled to be turned on/off by the first selection line DSL, has a gate electrode connected to the first selection line DSL, but includes no floating gate FG. A second selection transistor S-TR, which is controlled to be turned on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch circuit that connects the corresponding memory cell string STR to the source line SL. That is, the first selection transistor D-TR and the second selection transistor S-TR can be used to activate or deactivate an operation of the corresponding memory cell string STR.

In some embodiments, a memory system including the memory device applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system turns on both of the first and second selection transistors D-TR and S-TR during a read operation or a verification operation. Accordingly, during the read operation or the verification operation, an electric current may flow through the corresponding memory cell string STR and drain to the source line SL, which corresponds to the ground, such that a voltage level of a bit line BL connected to the corresponding memory cell string STR can be measured. However, during the read operation, there may be a time difference in the on/off timing between the first selection transistor D-TR and the second selection transistor S-TR.

The memory system may apply a predetermined erasure voltage (e.g., +20V) to a substrate through the source line SL during an erasure operation. The memory system applies a certain voltage to allow both the first selection transistor D-TR and the second selection transistor S-TR to be floated during the erasure operation. As a result, the applied erasure voltage can remove electrical charges from floating gates FG of selected memory cells.

Figure 4:
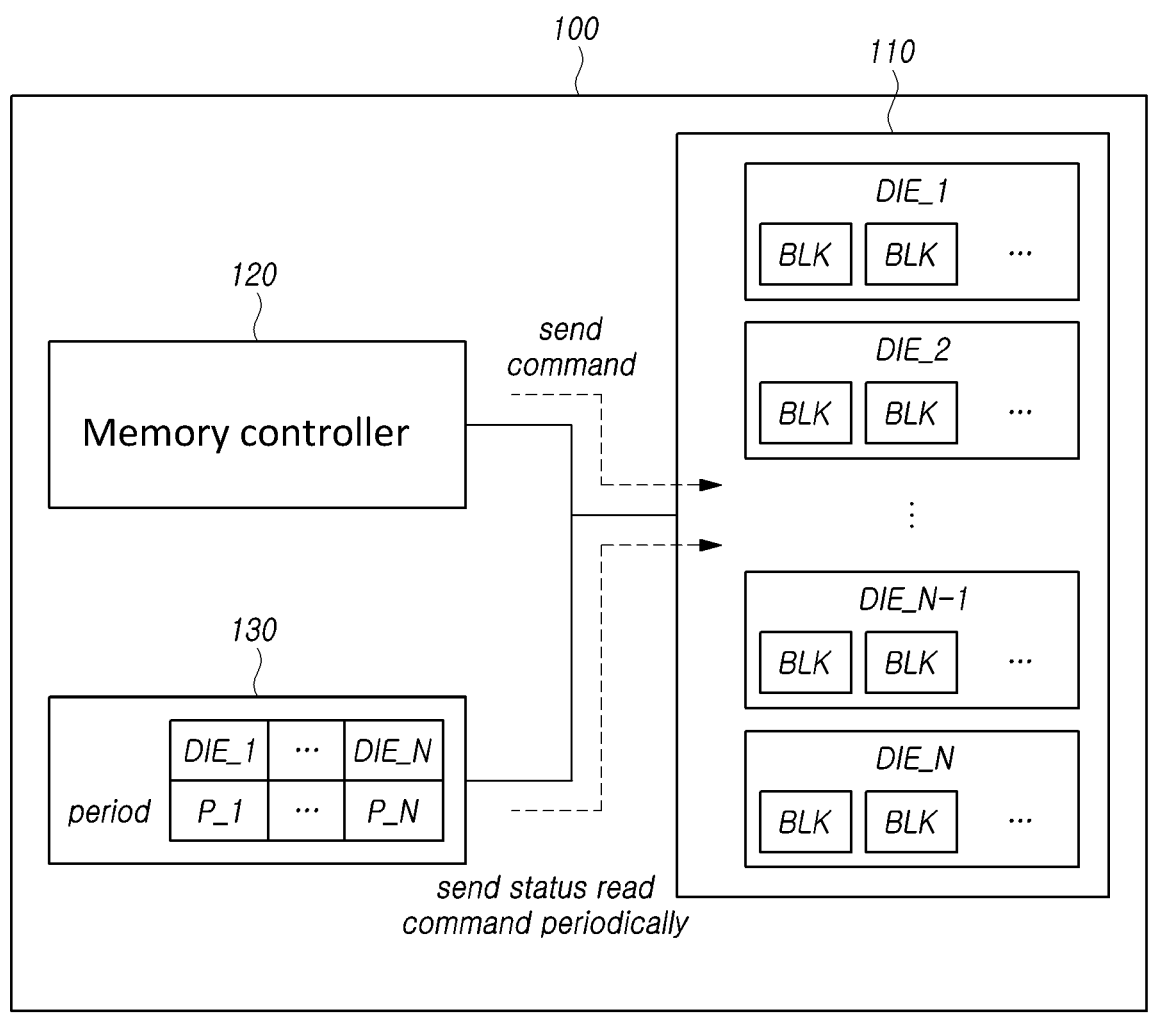
FIG. 4 illustrates a memory system in accordance with an embodiment of the present disclosure.

FIG. 4 illustrates a memory system 100 in accordance with an embodiment of the present disclosure.

Referring to FIG. 4, the memory system 100 may include a memory device 110, a memory controller 120, and a timer 130.

The memory device 110 may include N memory dies DIE_1, DIE_2, . . . , DIE_N−1, and DIE_N (N is a natural number greater than or equal to 2). Each of the N memory dies DIE_1, DIE_2, . . . , DIE_N−1, and DIE_N may include a plurality of memory blocks BLK.

The memory controller 120 may communicate with the memory device 110 and control the memory device 110. The memory controller 120 may transmit a command to the memory device 110 to read data from the memory device 110 or to write data into the memory device 110.

The timer 130 is a module that may transmit a status read command periodically for each of the plurality of memory dies DIE_1, DIE_2, . . . , DIE_N−1, and DIE_N to the memory device 110 based on a status read check period set for each of the plurality of memory dies DIE_1, DIE_2, . . . , DIE_N−1, and DIE_N. In this case, the status read check periods for the plurality of memory dies DIE_1, DIE_2, . . . , DIE_N−1, and DIE_N may be different from each other. The status read command is a command for instructing the memory device 110 to read out a status of a corresponding memory die. The status read check period is a time window allowed to perform an operation of transmitting the status read command to the memory device 110, and may be defined by a status read start time point and a duration.

Meanwhile, the timer 130 may determine a time point at which an operation of transmitting the status read command for each of the plurality of memory dies DIE_1, DIE_2, . . . , DIE_N−1, and DIE_N to the memory device 110 is started, based on a status read start time point predetermined for each of the plurality of memory dies DIE_1, DIE_2, . . . , DIE_N−1, and DIE_N. In this case, the status read start time points for the plurality of memory dies DIE_1, DIE_2, . . . , DIE_N−1, and DIE_N may be different with each other. The status read start time point may represent a starting point of time at which the status read command for each of the plurality of memory dies DIE_1, DIE_2, . . . , DIE_N−1, and DIE_N is transmitted to the memory device 110.

The memory controller 120 may determine target status read check periods P_1, . . . , and P_N respectively for the plurality of memory dies DIE_1, DIE_2, . . . , DIE_N−1, and DIE_N.

For example, the timer 130 may include a plurality of sub-modules (e.g., register, RAM, or the like) to store the target status read check periods P_1, . . . , and P_N for the plurality of memory dies DIE_1, DIE_2, . . . , DIE_N−1, and DIE_N. The memory controller 120 may differently set the target status read check periods P_1, . . . , and P_N for the plurality of memory dies DIE_1, DIE_2, . . . , DIE_N−1, and DIE_N by differently setting the plurality of sub-modules corresponding to the plurality of memory dies DIE_1, DIE_2, . . . , DIE_N−1, and DIE_N.

Meanwhile, the timer 130 may be located outside or inside the memory controller 120.

Figure 5:
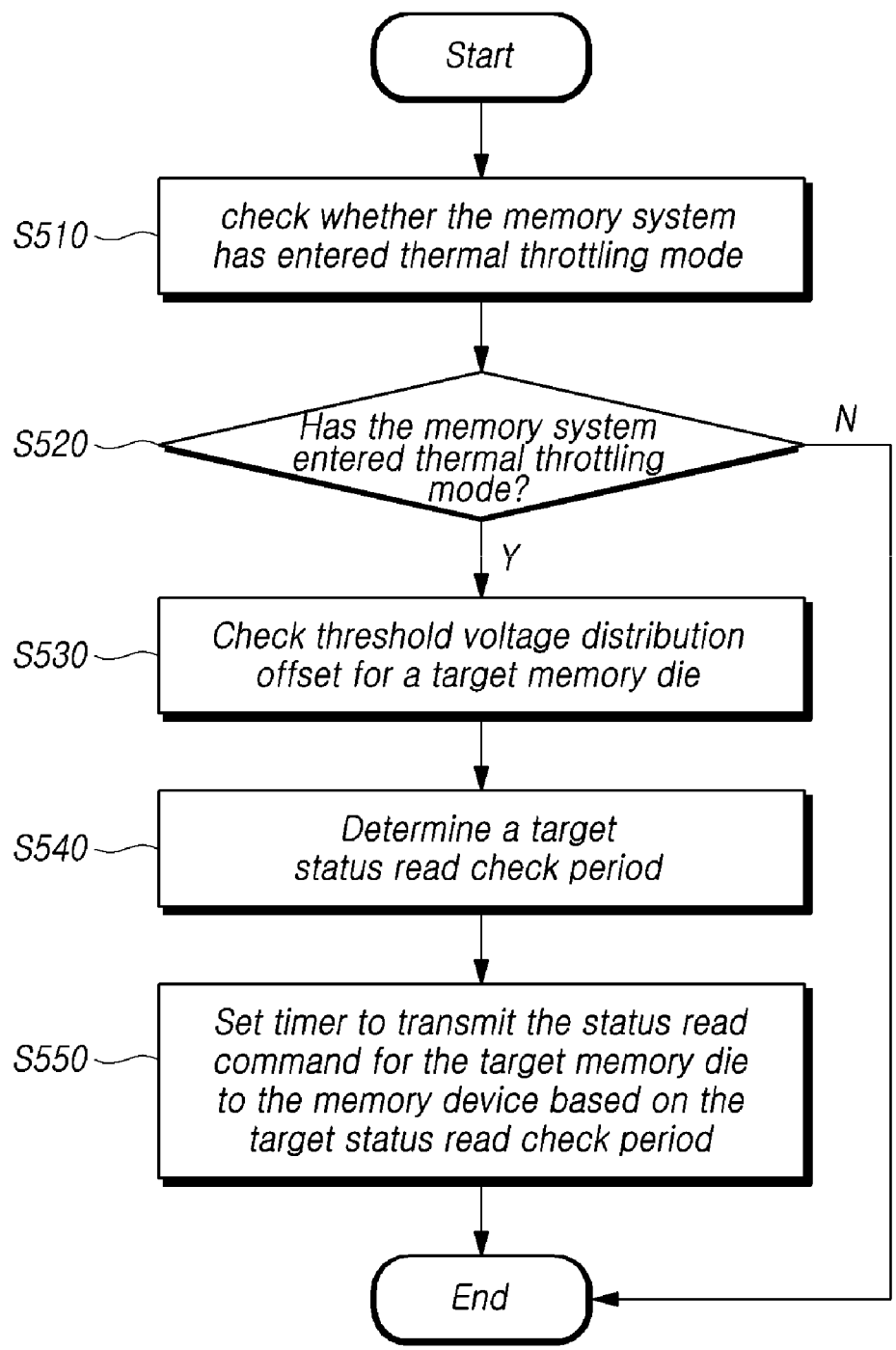
FIG. 5 is a flow chart illustrating an operation of a memory system in accordance with an embodiment of the present disclosure.

FIG. 5 is a flow chart illustrating an operation of a memory system in accordance with an embodiment of the present disclosure. The memory system of FIG. 5 may correspond to the memory system 100 of FIG. 4, and thus the operation illustrated in FIG. 5 will be described with reference to FIG. 4.

Referring to FIGS. 4 and 5, the memory controller 120 of the memory system 100 may check whether the memory system 100 has entered a thermal throttling mode (S510). When the memory system 100 has entered the thermal throttling mode, the memory controller 120 may control the performance of the memory device 110 to prevent a temperature of the memory system 100 from rising above a certain temperature. So the memory system 100 may protect the memory device 110 and the memory controller 120.

The memory controller 120 may determine whether the memory system 100 has entered the thermal throttling mode (S520). When it is determined at S520 that the memory system 100 has not entered the thermal throttling mode (S520-N), the memory controller 120 may terminate the operation of the memory system 100, e.g., an operation of setting the timer 130.

On the other hand, when it is determined at S520 that the memory system 100 has entered the thermal throttling mode (S520—Y), the memory controller 120 may check a threshold voltage distribution offset for a target memory die (S530). The target memory die may be one of the plurality of memory dies DIE_1, DIE_2, . . . , DIE_N−1, and DIE_N in the memory device 110.

The threshold voltage distribution offset for the target memory die is a value representing how much a threshold voltage distribution of a plurality of memory cells in the target memory die shifts from a reference threshold voltage distribution.

The threshold voltage distribution of the plurality of memory cells in the target memory die may be expressed on a graph which indicates a relationship between a threshold voltage value and the number of memory cells having the threshold voltage value. The graph may be refer to as a threshold voltage distribution graph. How much the threshold voltage distribution of the plurality of memory cells included in the target memory die has shifted may be determined by the degree to which the threshold voltage of the memory cells has shifted on the threshold voltage distribution graph.

For example, when the threshold voltage distribution of the plurality of memory cells included in the target memory die has shifted to the left from the reference threshold voltage distribution on the threshold voltage distribution graph (that is, the threshold voltage of the memory cells has decreased generally), the threshold voltage distribution offset may have a negative value.

For another example, when the threshold voltage distribution of the plurality of memory cells included in the target memory die has shifted to the right from the reference threshold voltage distribution on the threshold voltage distribution graph (that is, the threshold voltage of the memory cells has increased generally), the threshold voltage distribution offset may have a positive value.

In an embodiment, how much the threshold voltage distribution of the plurality of memory cells included in the target memory die has shifted to the left or to the right from the reference threshold voltage distribution may be determined based on a difference between a) the number of memory cells determined on-cell by a specific read voltage in the plurality of memory cells included in the target memory die and b) a reference number. The reference number may be the number of memory cells determined on-cell by the specific read voltage in the plurality of memory cells included in the target memory die when the distribution of the plurality of memory cells is the reference threshold voltage distribution.

The memory controller 120 may determine a target status read check period, which is a status read check period for the target memory die, based on a threshold voltage distribution offset for the target memory die (S540). The target status read check period includes a target status read start time point and a target duration or target time period.

The memory controller 120 may set the timer 130 to transmit the status read command for the target memory die to the memory device 110 at the target status read start time point based on the target status read check period (S550).

The memory controller 120 may transmit the status read command to the memory device 110 during the target time period based on the setting of the timer 130, and may determine a status of the target memory die based on a response of the memory device 110, the response corresponding to the transmitted status read command.

The reason why the memory controller 120 determines, when the memory system 100 has entered the thermal throttling mode, the target status read check period based on the threshold voltage distribution offset for the target memory die is as follows.

When the memory system 100 has entered the thermal throttling mode, an error is more likely to occur during a read or write operation in a memory die of which a threshold voltage distribution highly shifts to the left from the reference threshold voltage distribution on the threshold voltage distribution graph.

So, the memory system 100 may determine, among the plurality of memory dies in the memory device 110, the target memory die with a high probability of the error occurrence based on the threshold voltage distribution offset. And, the memory system 100 may increase the duration of the status read check period for the target memory die to reduce a temperature of the target memory die.

When the memory system 100 performs a read or write operation on the target memory die, the memory system 100 may transmit a status read command to the memory device 110 to check a result of execution. Therefore, in the case that the duration of the status read check period for the target memory die is increased, an amount of time allowed for performing the read or write operation on the target the memory die is also increased. As a result, a load on the target memory die is reduced, and thus the temperature of the target memory die is reduced.

Meanwhile, when it is determined at S520 that the memory system 100 has entered the thermal throttling mode (S520—Y), the memory controller 120 may additionally determine the target status read start time point for the target memory die based on the threshold voltage distribution offset for the target memory die.

Hereinafter, an operation of determining whether the memory system 100 has entered the thermal throttling mode to change the status read check period for the target memory die will be described.

Figure 6:
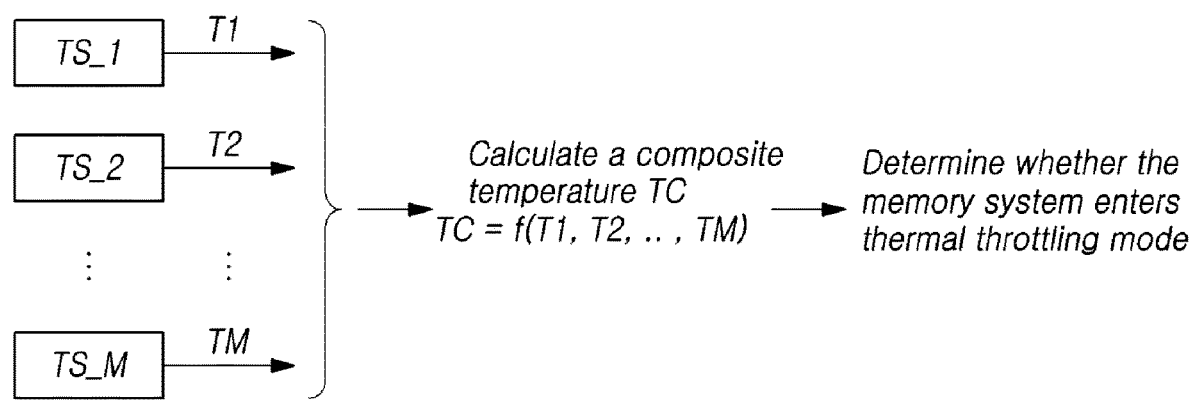
FIG. 6 illustrates an operation of determining whether a memory system has entered a thermal throttling mode in accordance with an embodiment of the present disclosure.

FIG. 6 illustrates an operation of determining whether a memory system has entered a thermal throttling mode in accordance with an embodiment of the present disclosure. The memory system of FIG. 6 may correspond to the memory system 100 of FIG. 4, and thus the operation illustrated in FIG. 6 will be described with reference to FIG. 4.

Referring to FIGS. 4 and 6, the memory controller 120 of the memory system 100 may determine whether the memory system 100 has entered the thermal throttling mode using a plurality of thermal sensors $TS\_1, TS\_2, \ldots,$ and $TS\_M$ included in the memory system 100, M being a natural number equal to or greater than 2.

Each of the plurality of thermal sensors $TS\_1, TS\_2, \ldots,$ and $TS\_M$ included in the memory system 100 may measure a temperature of a specific module or area in the memory system 100.

For example, one of the plurality of thermal sensors $TS\_1, TS\_2, \ldots,$ and $TS\_M$ may be located inside the memory controller 120 and measure a temperature of the memory controller 120. For another example, another one of the plurality of thermal sensors $TS\_1, TS\_2, \ldots,$ and $TS\_M$ may be located inside a PCB (printed circuit board) in the memory system 100 and measure a temperature of the PCB.

The memory controller 120 may calculate a composite temperature TC based on a plurality of temperatures $T1, T2, \ldots,$ and TM respectively measured by the plurality of thermal sensors $TS\_1, TS\_2, \ldots,$ and $TS\_M$.

In an embodiment, the memory controller 120 may calculate the composite temperature TC by using weights $C1, C2, \ldots,$ and CM of the plurality of thermal sensors $TS\_1, TS\_2, \ldots,$ and $TS\_M$ and the plurality of temperatures $T1, T2, \ldots,$ and TM. In this case, the weights $C1, C2, \ldots,$ and CM may be predetermined.

$$TC = C1*T1 + C2*T2 + \ldots + CM*TM$$

In another embodiment, the memory controller 120 may calculate the composite temperature TC as an average of the plurality of temperatures $T1, T2, \ldots,$ and TM.

$$TC = (T1 + T2 + \ldots + TM)/M$$

The memory controller 120 may determine whether the memory system 100 has entered the thermal throttling mode based on the calculated composite temperature TC.

Figure 7:
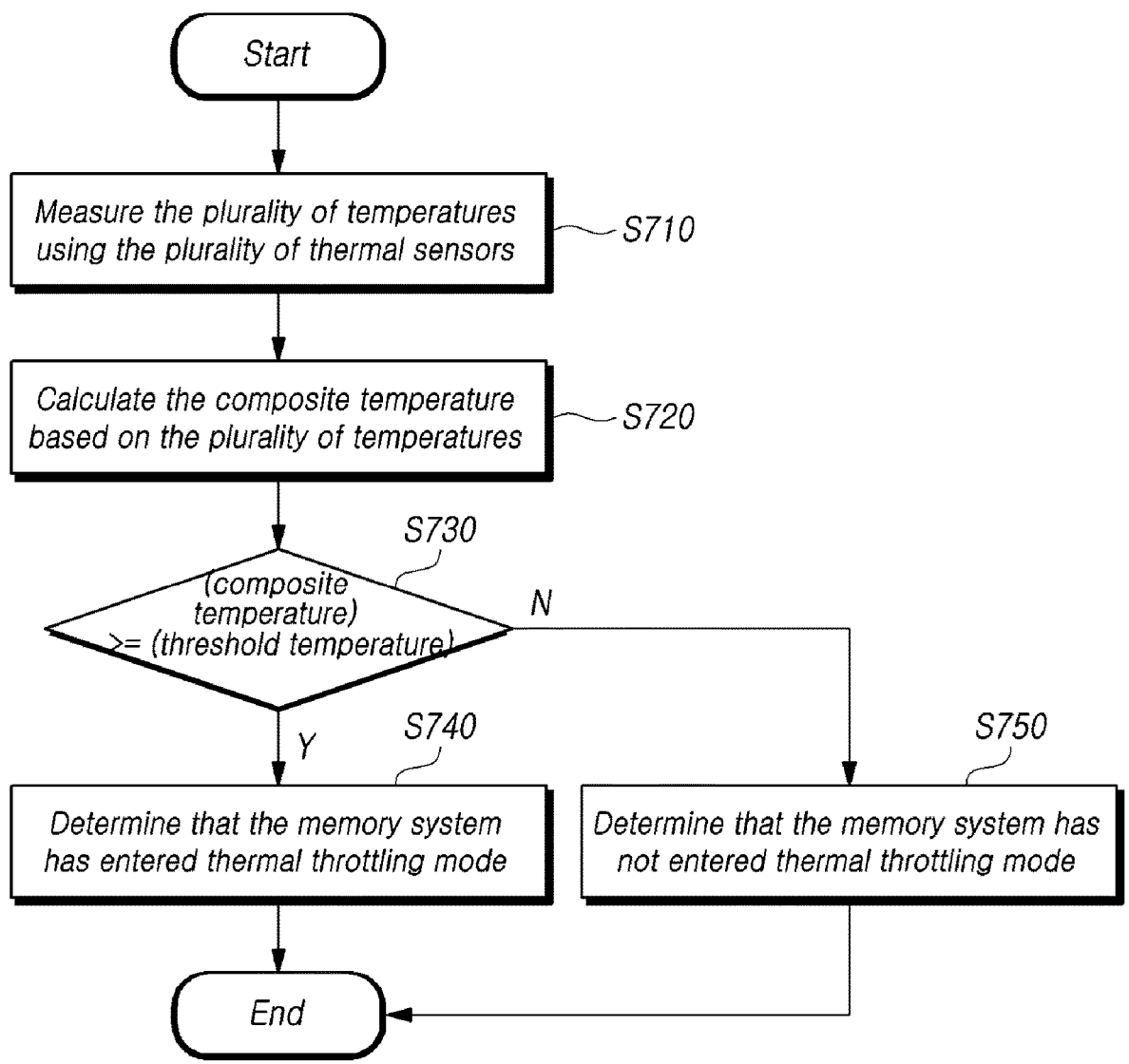
FIG. 7 is a flow chart illustrating the operation described in FIG. 6 in accordance with an embodiment of the present disclosure.

FIG. 7 is a flow chart illustrating the operation disclosed in FIG. 6 in accordance with an embodiment of the present disclosure.

Referring to FIG. 7, the memory controller 120 of the memory system 100 may measure the plurality of temperatures T1, T2, . . . , and TM using the plurality of thermal sensors TS_1, TS_2, . . . , and TS_M (S710).

After that, the memory controller 120 may calculate the composite temperature TC based on the plurality of temperatures T1, T2, . . . , and TM (S720). The memory controller 120 may calculate the composite temperature TC according to the method described with reference to FIG. 6.

Then, the memory controller 120 may determine whether the composite temperature TC is equal to or greater than a threshold temperature (S730). The threshold temperature may be preset.

When the composite temperature TC is equal to or greater than the threshold temperature (S730—Y), the memory controller 120 may determine that the memory system 100 has entered the thermal throttling mode (S740).

On the other hand, when the composite temperature TC is lower than the threshold temperature (S730—N), the memory controller 120 may determine that the memory system 100 has not entered the thermal throttling mode (S750).

Figure 8:
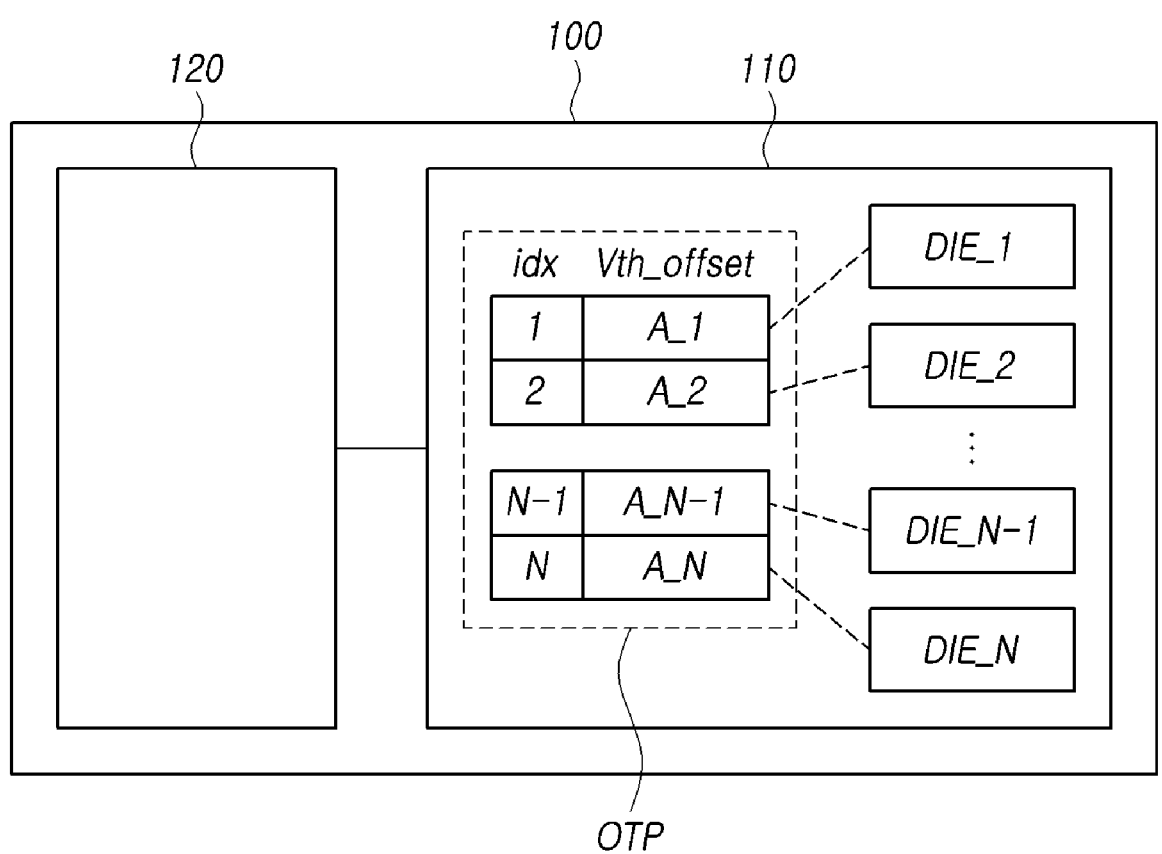
FIG. 8 illustrates an operation of storing a threshold voltage distribution offset in accordance with an embodiment of the present disclosure.

FIG. 8 illustrates an operation of storing a threshold voltage distribution offset in accordance with an embodiment of the present disclosure.

Referring to FIG. 8, a memory system 100 may include an OTP (One Time Programmable) area. The OTP area is a memory area in which it is impossible to program additional data once data has been programmed. The memory system 100 may first program data in the OTP area using an OTP command.

The OTP area may be located in a separate memory chip included in a memory controller 120, located in a separate area in a memory device 110, or located in a plurality of memory dies DIE_1, DIE_2, . . . , DIE_N-1, and DIE_N in the memory device 110. Hereinafter, in FIG. 8, a case in which the OTP area is located in a separate area in the memory device 110 will be described. In the memory device 110, the separate area is outside the plurality of memory dies DIE_1, DIE_2, . . . , DIE_N-1, and DIE_N.

In FIG. 8, the memory controller 120 may store, in the OTP area, threshold voltage distribution offsets A_1, A_2, . . . , A_N-1, and A_N respectively for the plurality of memory dies DIE_1, DIE_2, . . . , DIE_N-1, and DIE_N.

As described above, the data stored in the OTP area cannot be modified once recorded in the OPT area. That is, once the memory controller 120 stores the threshold voltage distribution offset for each of the plurality of memory dies DIE_1, DIE_2, . . . , DIE_N-1, and DIE_N in the OTP area, the threshold voltage distribution offset for each of the plurality of memory dies DIE_1, DIE_2, . . . , DIE_N-1, and DIE_N does not change anymore.

Meanwhile, the memory system 100 may store the threshold voltage distribution offset for each of the plurality of memory dies DIE_1, DIE_2, . . . , DIE_N-1, and DIE_N in the OTP area when the memory system 100 is manufactured.

FIG. 9 illustrates an operation of determining a threshold voltage distribution offset for a target memory die in accordance with an embodiment of the present disclosure. The operation illustrated in FIG. 9 will be described with reference to FIG. 4.

The memory controller 120 of the memory system 100 may determine the threshold voltage distribution offset for the target memory die based on a difference between a) an average of threshold voltage distributions of the plurality of memory dies DIE_1, DIE_2, . . . , DIE_N-1, and DIE_N and b) a threshold voltage distribution of the target memory die.

In FIG. 9, it is assumed that the threshold voltage distributions of the plurality of memory dies DIE_1, DIE_2, . . . , DIE_N-1, and DIE_N are VTH_1, VTH_2, . . . , VTH_N-1, and VTH_N, and the target memory die is the memory die DIE_1.

At this time, the threshold voltage distribution offset for the target memory die may be determined based on a difference between a) ((VTH_1+VTH_2+ . . . +VTH_N-1+VTH_N)/N), which is the average of the threshold voltage distributions of the plurality of memory dies DIE_1, DIE_2, . . . , DIE_N-1, and DIE_N and b) VTH_1, which is the threshold voltage distribution of the target memory die. That is, the threshold voltage distribution offset for the target memory die, i.e., Vth_offset (DIE_1), is determined by subtracting VTH_1 from ((VTH_1+VTH_2+ . . . +VTH_N-1+VTH_N)/N).

Figure 10:
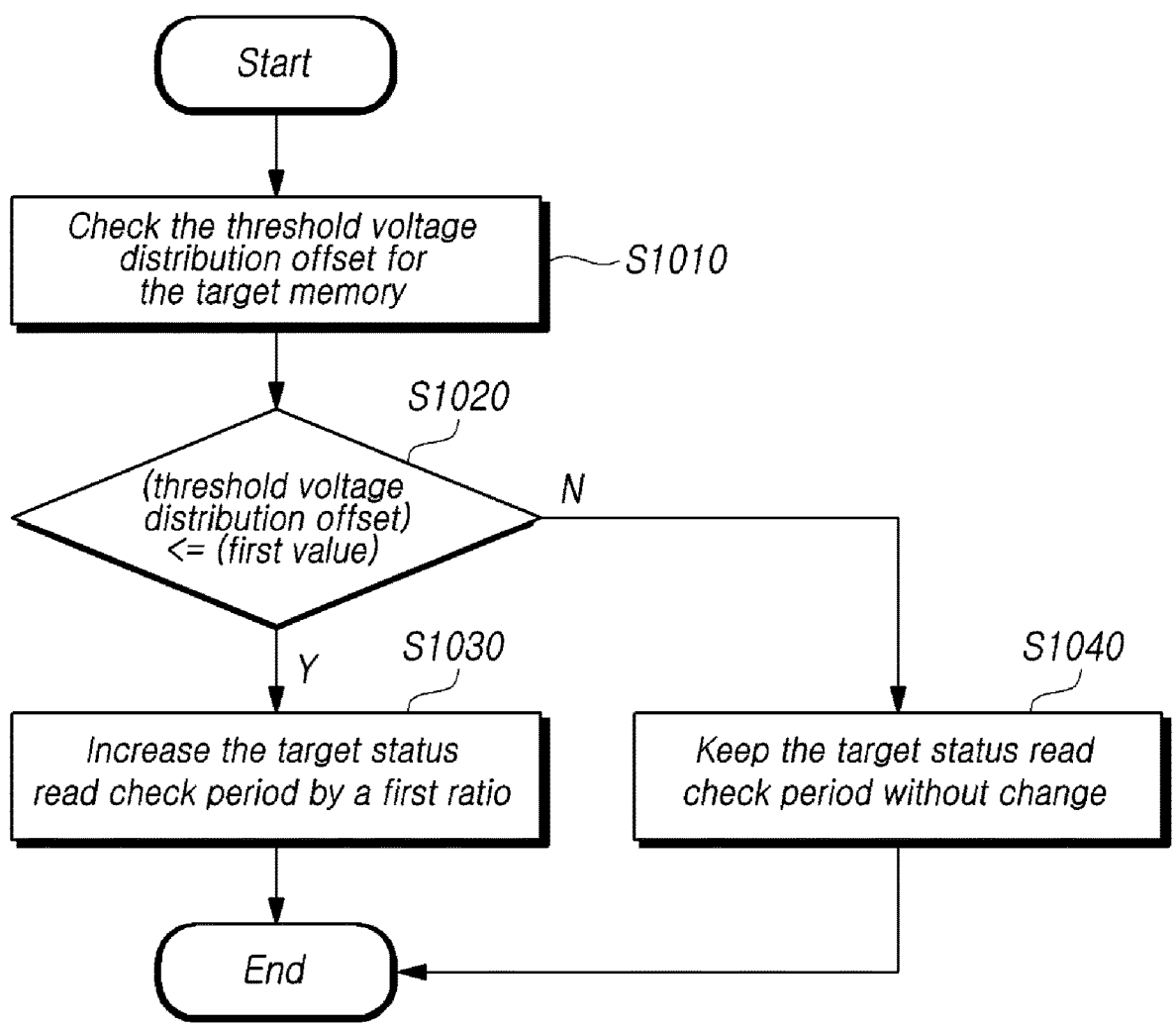
FIG. 10 is a flow chart illustrating an operation of changing a status read check period for a target memory die in accordance with an embodiment of the present disclosure.

FIG. 10 illustrates an operation of changing a status read check period for a target memory die in accordance with an embodiment of the present disclosure. The operation illustrated in FIG. 10 will be described with reference to FIG. 4.

Referring to FIGS. 4 and 10, the memory controller 120 of the memory system 100 may check a threshold voltage distribution offset for the target memory die (S1010).

The memory controller 120 may determine whether the threshold voltage distribution offset for the target memory die is equal to or smaller than a first value (S1020). The first value may be preset.

In the case that the threshold voltage distribution offset for the target memory die is equal to or smaller than the first value (S1020—Y), the memory controller 120 may increase a duration of a target status read check period, which is the status read check period for the target memory die, by a first rate (S1030). In an embodiment, the first value may be −50.

On the other hand, in the case that the threshold voltage distribution offset for the target memory die is greater than the first value (S1020—N), the memory controller 120 may keep the duration of the target status rad check period without changing it (S1040).

The reason why the memory controller 120 increases the duration of the target status read check period by the first rate when the threshold voltage distribution offset for the target memory die is equal to or smaller than the first value is as follows.

When the threshold voltage distribution offset for the target memory die is equal to or smaller than the first value, it means that the threshold voltage distribution of the target memory die highly shifts to the left from the reference threshold voltage distribution on the threshold voltage distribution graph and thus errors are likely to occur during a read or write operation for the target memory die. Therefore, as the threshold voltage distribution of the target memory die shifts to the left further on the threshold voltage distribution graph, errors are more likely to occur during the read or write operation for the target memory die. As the temperature of the target memory die increases, the threshold voltage distribution of the target memory die shifts to the left further on the threshold voltage distribution graph.

Therefore, the memory controller 120 may need to reduce the performance of the target memory die to lower the temperature of the target memory die in the thermal throttling mode. So, the memory controller 120 may increase the duration of the target status read check period by the first rate.

Meanwhile, the memory controller 120 may delay a status read start time point of the target status read check period for the target memory die by a first time to lower the performance of the target memory die in the thermal throttling mode. This will be executed, together or separately, with an operation of the memory controller 120 for increasing the duration of the target status read check period by the first rate.

The first rate, which is a rate that the duration of the target status read check period is increased, may be determined based on an absolute value of the first value. This will be described below with reference to FIG. 11.

Figure 11:
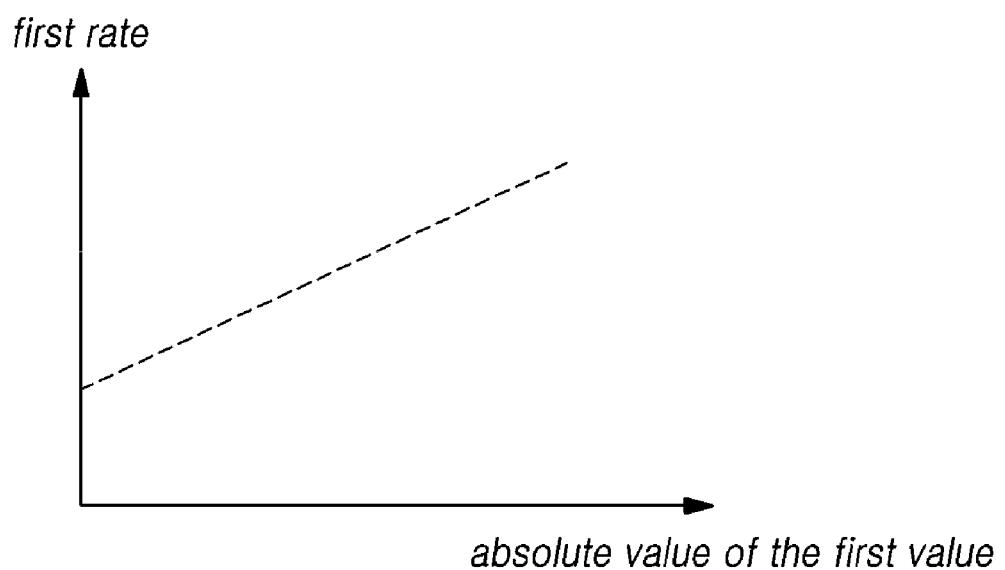
FIG. 11 is a graph illustrating a relationship between a first value and a first rate in accordance with an embodiment of the present disclosure.

FIG. 11 is a graph illustrating a relationship between a first value and a first rate in accordance with an embodiment of the present disclosure.

Referring to FIG. 11, the first rate may be proportional to an absolute value of the first value. The greater the absolute value of the first value, the greater the degree to which the threshold voltage distribution of the target memory die shifts to the left on the threshold voltage distribution graph when the duration of the target status check period is changed. Accordingly, the memory controller 120 may increase the first rate to increase a margin of increase of the duration of the target status read check period.

Figure 12:
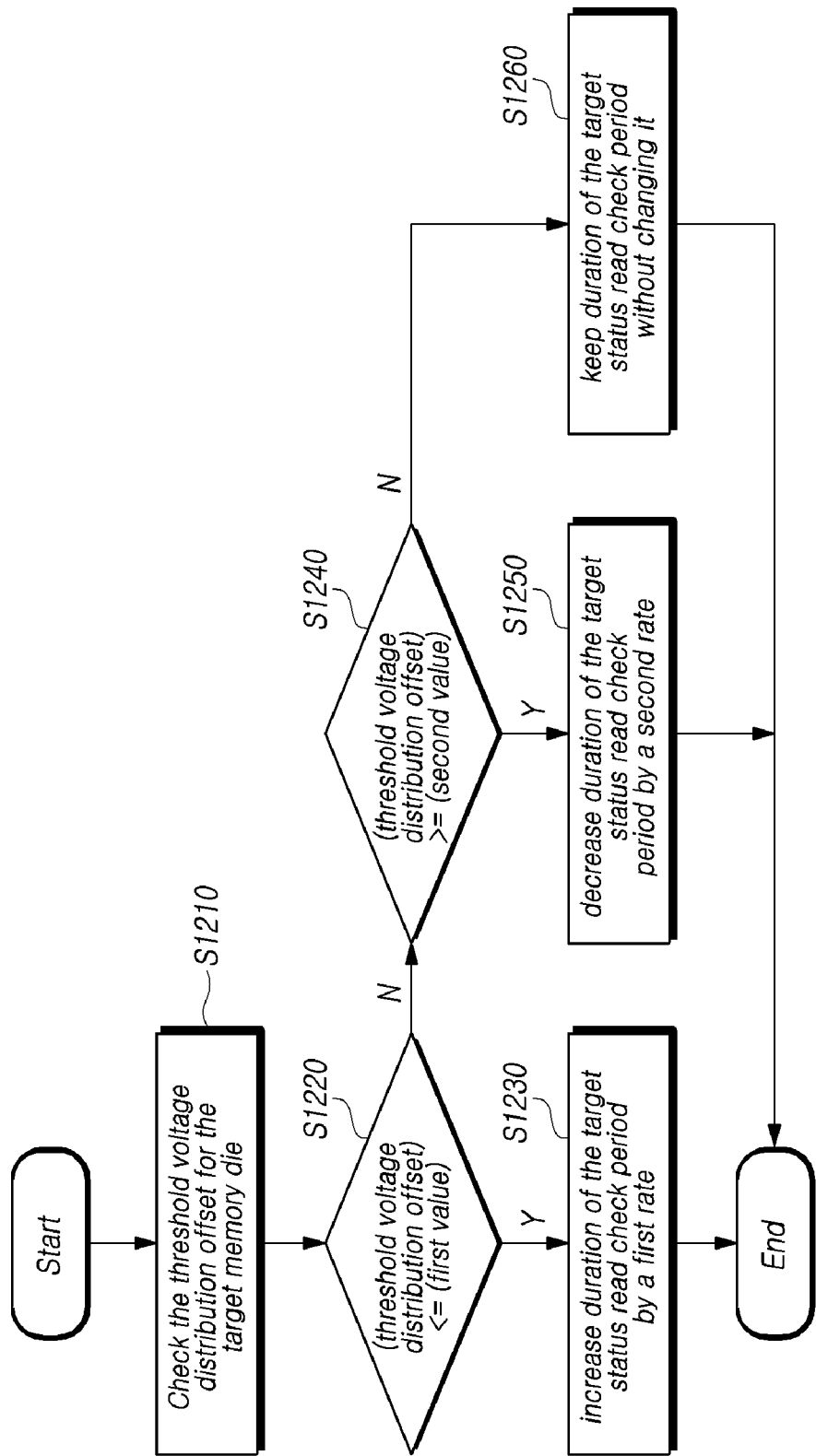
FIG. 12 is a flow chart illustrating an operation of changing a status read check period for a target memory die in accordance with another embodiment of the present disclosure.

FIG. 12 is a flow chart illustrating an operation of changing a status read check period for a target memory die in accordance with another embodiment of the present disclosure. The operation illustrated in FIG. 12 will be described with reference to FIG. 4.

Referring to FIGS. 4 and 12, the memory controller 120 of the memory system 100 may check a threshold voltage distribution offset for the target memory die (S1210).

The memory controller 120 may determine whether the threshold voltage distribution offset for the target memory die is equal to or smaller than a first value (S1220).

In the case that the threshold voltage distribution offset for the target memory die is equal to or smaller than the first value (S1220—Y), the memory controller 120 may increase a duration of a target status read check period, which is the status read check period for the target memory die, by a first rate (S1230).

On the other hand, in the case that the threshold voltage distribution offset for the target memory die is greater than the first value (S1220—N), the memory controller 120 may determine whether the threshold voltage distribution offset for the target memory die is equal to or greater than a second value (S1240). At this time, the second value may be preset and greater than the first value.

In the case that the threshold voltage distribution offset for the target memory die is equal to or greater than the second value (S1240—Y), the memory controller 120 may decrease the duration of the target status read check period by a second rate (S1250).

On the other hand, in the case that the threshold voltage distribution offset for the target memory die is smaller than the second value (S1240—N), the memory controller 120 may keep the duration of the target status read check period without changing it (S1260).

The reason why the memory controller 120 decreases the duration of the target status read check period by the second rate when the threshold voltage distribution offset for the target memory die is equal to or greater than the second value is as follows.

When the threshold voltage distribution offset for the target memory die is equal to or greater than the second value, it means that the threshold voltage distribution of the target memory die highly shifts to the right from the reference threshold voltage distribution on the threshold voltage distribution graph. The threshold voltage distribution of the target memory die shifts to the left on the threshold voltage distribution graph as the temperature of the target memory die increases. Therefore, although the memory system 100 enters the thermal throttling mode, errors are unlikely to occur during a read or write operation for the target memory die having the threshold voltage distribution that highly shifts to the right from the reference threshold voltage distribution. This is because the threshold voltage distribution of the target memory die will be closer to the reference threshold voltage distribution when the temperature of the target memory die increases in the thermal throttling mode.

That is, even though the temperature of the target memory die increases, it does not significantly affect an error rate of the target memory die. So, the memory controller 120 may decrease the duration of the target status read check period by the second rate, so that the temperature of the target memory die increases.

Meanwhile, the memory controller 120 may advance a status read start time point for the target memory die by a second time to increase the performance of the target memory die in the thermal throttling mode. This will be executed, together or separately, with the operation of the memory controller 120 for decreasing the duration of the target status read check period by the second rate.

The second rate, which is a rate that the duration of the target status read check period is decreased, may be determined based on an absolute value of the second value. This will be described below with reference to FIG. 13.

Figure 13:
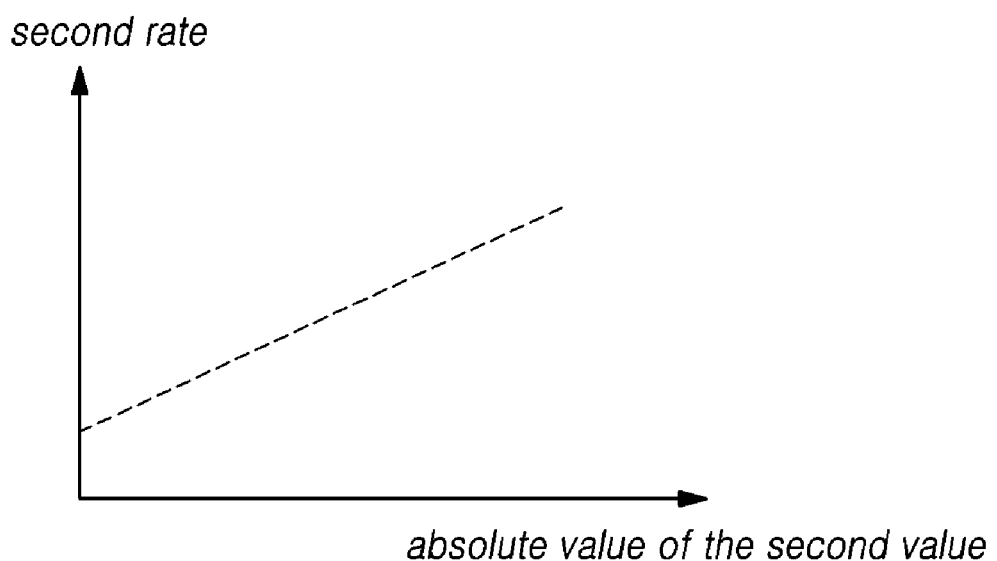
FIG. 13 is a graph illustrating a relationship between a second value and a second rate in accordance with an embodiment of the present disclosure.

FIG. 13 is a graph illustrating a relationship between the second value and the second rate in accordance with an embodiment of the present disclosure.

Referring to FIG. 13, the second rate may be proportional to the absolute value of the second value. The greater the absolute value of the second value, the greater the degree to which the threshold voltage distribution of the target memory die shifts to the right from the reference threshold voltage distribution on the threshold voltage distribution graph when the memory controller 120 changes the duration of the target status check period. Accordingly, the memory controller 120 may increase the second rate to increase a margin of increase of the duration of the target status read check period.

Figure 14:
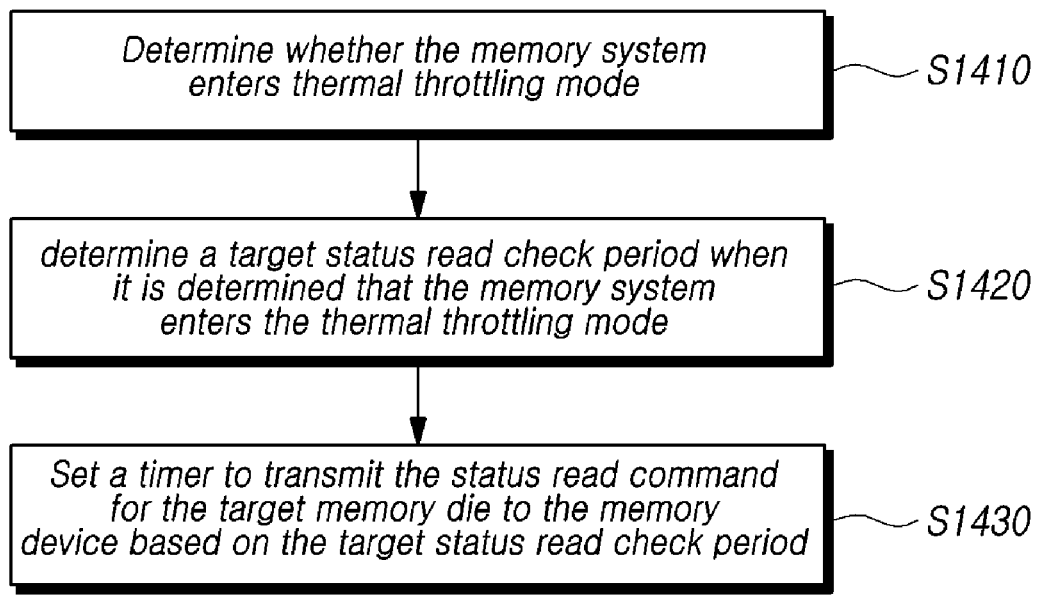
FIG. 14 is a flow chart showing a method of operating a memory system in accordance with an embodiment of the present disclosure.

FIG. 14 illustrates a method of operating a memory system in accordance with an embodiment of the present disclosure. The operation illustrated in FIG. 14 will be described with reference to FIG. 4.

Referring to FIGS. 4 and 14, the method may include determining whether the memory system 100 enters a thermal throttling mode (S1410).

For example, whether the memory system 100 enters the thermal throttling mode may be determined based on a composite temperature TC calculated based on a plurality of temperatures T1, T2, . . . , and TM respectively measured by a plurality of thermal sensors TS_1, TS_2, . . . , and TS_M included in the memory system 100.

At this time, it is determined that the memory system 100 enters the thermal throttling mode when the composite temperature TC is equal to or greater than a preset threshold temperature.

And the method may further include determining, when it is determined that the memory system 100 enters the thermal throttling mode, a target status read check period, which is a status read check period for a target memory die among the plurality of memory dies DIE_1, DIE_2, . . . , DIE_N−1, and DIE_N of the memory device 110, based on a threshold voltage distribution offset for the target memory die (S1420).

For example, the threshold voltage distribution offset for the target memory die is determined based on a difference between a) an average of threshold voltage distributions of the plurality of memory dies DIE_1, DIE_2, . . . , DIE_N–1, and DIE_N and b) a threshold voltage distribution for the target memory die.

For example, a duration of the target status read check period may be increased by a first rate when the threshold voltage distribution offset for the target memory die is equal to or smaller than a first value. At this time, the first rate may be determined based on an absolute value of the first value.

For another example, the duration of the target status read check period may be decreased by a second rate when the threshold voltage distribution offset for the target memory die is equal to or greater than a second value. At this time, the second rate may be determined based on an absolute value of the second value. The second value may be greater than the first value.

The method may further include setting the timer 130 to transmit a status read command for the target memory die to the memory device 110 based on the target status read check period (S1430).

Figure 15:
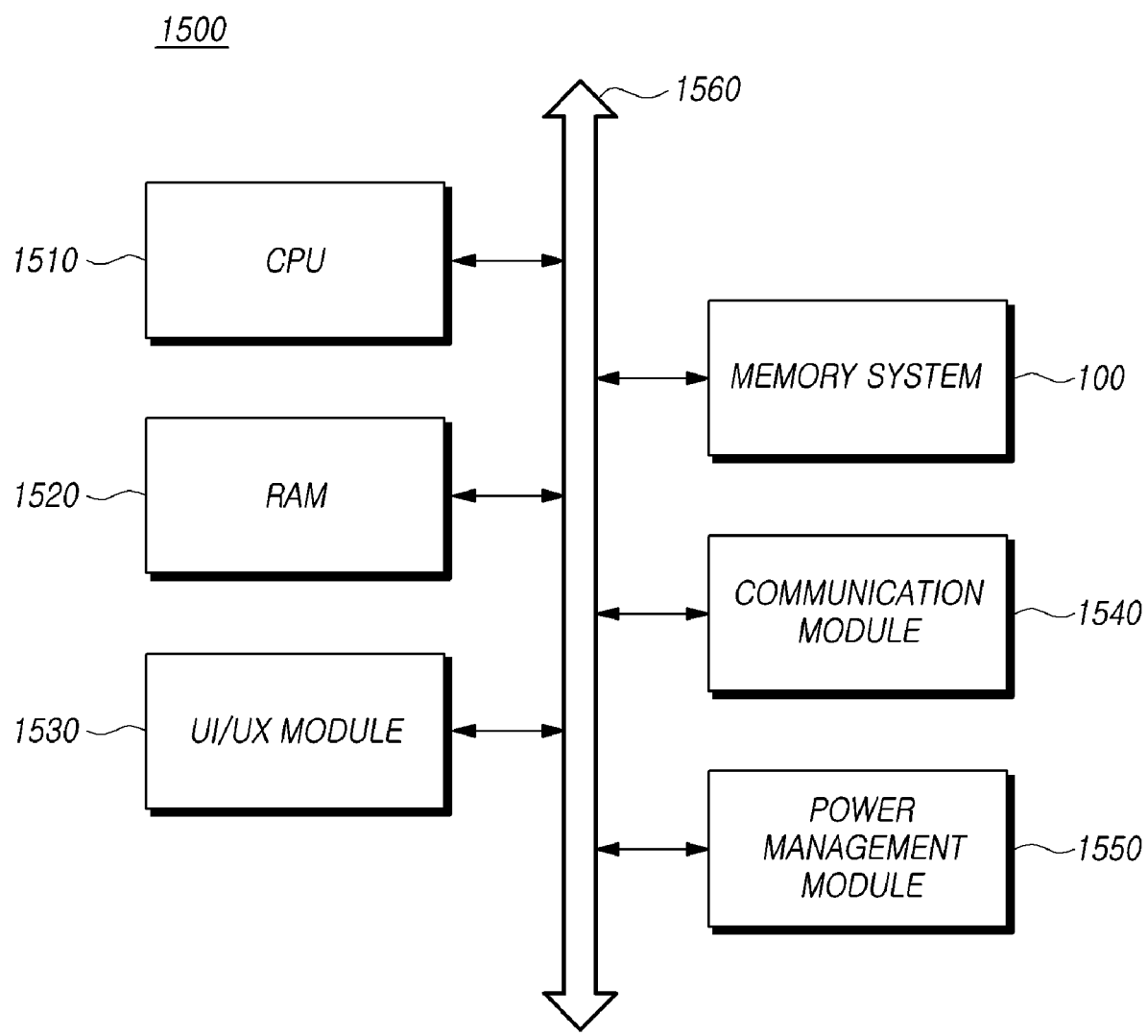
FIG. 15 illustrates a computing system in accordance with an embodiment of the present disclosure.

FIG. 15 illustrates a computing system 1500 in accordance with an embodiment of the present disclosure.

Referring to FIG. 15, the computing system 1500 may include: a memory system 100 electrically connected to a system bus 1560; a CPU 1510 configured to control the overall operation of the computing system 1500; a RAM 1520 configured to store data and information related to operations of the computing system 1500; a user interface/user experience (UI/UX) module 1530 configured to provide the user with a user environment; a communication module 1540 configured to communicate with an external device as a wired and/or wireless type; and a power management module 1550 configured to manage power used by the computing system 1500.

The computing system 1500 may be a personal computer (PC) or may include a mobile terminal such as a smartphone, a tablet or various electronic devices.

The computing system 1500 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices having various types and mounted inside various electronic devices.

Based on embodiments of the disclosed technology described above, an operation delay time of a memory system may be advantageously reduced or minimized. In addition, based on an embodiment of the disclosed technology, an overhead occurring in a process of calling a specific function may be advantageously reduced or minimized.

Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims.

What is claimed is:

1. A memory system, comprising;
   a memory device including a plurality of memory dies;
   a memory controller communicating with the memory device and configured to control the memory device; and
   a timer configured to transmit a status read command for each of the plurality of memory dies to the memory device based on a status read check period set for each of the plurality of memory dies,
   wherein, when the memory system enters a thermal throttling mode, the memory controller is configured to determine a target status read check period, which is a status read check period for a target memory die among the plurality of memory dies, based on a threshold voltage distribution offset for the target memory die,
   wherein the memory controller is configured to set the timer to transmit the status read command for the target memory die to the memory device based on the target status read check period, and
   wherein the memory device reads out a status of each of the plurality of memory dies in response to the status read command, and the status read check period determines a time period in which the status read command is transmitted to the memory device.

2. The memory system according to claim 1, further comprising a plurality of thermal sensors,
   wherein the memory controller is configured to determine whether the memory system enters the thermal throttling mode using a composite temperature calculated based on a plurality of temperatures measured respectively by the plurality of thermal sensors.

3. The memory system according to claim 2, wherein the memory controller is configured to determine that the memory system enters the thermal throttling mode when the composite temperature is equal to or greater than a preset threshold temperature.

4. The memory system according to claim 1, further comprising an OTP (one time programmable) area,
   wherein the memory controller is configured to store an threshold voltage distribution offset for each of the plurality of memory dies in the OTP area.

5. The memory system according to claim 1, wherein the memory controller is configured to determine the threshold voltage distribution offset for the target memory die based on a difference between an average of threshold voltage distributions of the plurality of memory dies and a threshold voltage distribution of the target memory die.

6. The memory system according to claim 1, wherein the memory controller is configured to increase a duration of the target status read check period by a first rate when the threshold voltage distribution offset for the target memory die is equal to or smaller than a first value.

7. The memory system according to claim 6, wherein the first rate is determined based on an absolute value of the first value.

8. The memory system according to claim 6, wherein the memory controller is configured to decrease the duration of the target status read check period by a second rate when the threshold voltage distribution offset for the target memory die is equal to or greater than a second value.

9. The memory system according to claim 8, wherein the second rate is determined based on an absolute value of the second value.

10. The memory system according to claim 1, wherein the timer is configured to determine a time point at which an operation of transmitting the status read command for each of the plurality of memory dies to the memory device is started, based on a status read start time point for each of the plurality of memory dies, and
wherein the memory controller is configured to determine the status read start time point for the target memory die based on the threshold voltage distribution offset for the target memory die when the memory system enters the thermal throttling mode.

11. A method of operating a memory system including a memory device including a plurality of memory dies, a timer configured to transmit a status read command for each of the plurality of memory dies to the memory device based on a status read check period set for each of the plurality of memory dies, the method comprising:
determining whether the memory system enters a thermal throttling mode;
determining, upon the memory system entering the thermal throttling mode, a target status read check period, which is a status read check period for a target memory die among the plurality of memory dies, based on a threshold voltage distribution offset for the target memory die; and
setting the timer to transmit the status read command for the target memory die to the memory device based on the target status read check period,
wherein the memory device reads out a status of each of the plurality of memory dies in response to the status read command, and the status read check period determines a time period in which the status read command is transmitted to the memory device.

12. The method according to claim 11, wherein the determining whether the memory system enters the thermal throttling mode includes determining whether the memory system enters the thermal throttling mode using a composite temperature calculated based on a plurality of temperatures respectively measured by a plurality of thermal sensors.

13. The method according to claim 12, wherein the determining whether the memory system enters the thermal throttling mode includes determining that the memory system enters the thermal throttling mode when the composite temperature is equal to or greater than a preset threshold temperature.

14. The method according to claim 11, wherein the threshold voltage distribution offset for the target memory die is determined based on a difference between an average of threshold voltage distributions of the plurality of memory dies and a threshold voltage distribution of the target memory die.

15. The method according to claim 11, wherein the determining the target status read check period includes increasing a duration of the target status read check period by a first rate when the threshold voltage distribution offset for the target memory die is equal to or smaller than a first value.

16. The method according to claim 15, wherein the first rate is determined based on an absolute value of the first value.

17. The method according to claim 15, wherein the determining the target status read check period includes decreasing the duration of the target status read check period by a second rate when the threshold voltage distribution offset for the target memory die is equal to or greater than a second value.

18. The method according to claim 17, wherein the second rate is determined based on an absolute value of the second value.

19. The method according to claim 11, further comprising:
determining a status read start time point for the target memory die based on the threshold voltage distribution offset for the target memory die when it is determined that the memory system enters the thermal throttling mode,
wherein a time point at which an operation of transmitting the status read command for each of the plurality of memory dies to the memory device is started is determined, by the timer, based on a status read start time point for each of the plurality of memory dies.

* * * * *